(12) United States Patent
Chaiken et al.

(10) Patent No.: US 10,684,913 B2
(45) Date of Patent: Jun. 16, 2020

(54) SYSTEMS AND METHODS FOR DETECTING ERRORS AND/OR RESTORING NON-VOLATILE RANDOM ACCESS MEMORY USING ERROR CORRECTION CODE

(71) Applicant: DELL PRODUCTS L.P., Round Rock, TX (US)

(72) Inventors: Craig L. Chaiken, Pflugerville, TX (US); Balasingh P. Samuel, Round Rock, TX (US); Zhao Hui Yu, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 126 days.

(21) Appl. No.: 15/962,665

(22) Filed: Apr. 25, 2018

(65) Prior Publication Data
US 2019/0332468 A1    Oct. 31, 2019

(51) Int. Cl.
*G06F 11/10*    (2006.01)
*G06F 11/07*    (2006.01)
(Continued)

(52) U.S. Cl.
CPC .......... *G06F 11/106* (2013.01); *G06F 1/3275* (2013.01); *G06F 3/0619* (2013.01);
(Continued)

(58) Field of Classification Search
CPC .. G06F 11/106; G06F 11/0772; G06F 3/0619; G06F 3/0679; G06F 11/1068;
(Continued)

(56) References Cited

U.S. PATENT DOCUMENTS 6,092,213 A * 7/2000 Lennie ................ G06F 11/1415
    714/3
7,844,886 B1 * 11/2010 Ngo ..................... G06F 11/1004
    714/725
(Continued)

OTHER PUBLICATIONS

Wen Xu, Zhiyong Xiong and Cheng Gong, "A method of Integrated Modular Avionics system configuration data management," 2015 IEEE/AIAA 34th Digital Avionics Systems Conference (DASC), Prague, 2015, pp. 6D4-1-6D4-8. (Year: 2015).*
(Continued)

*Primary Examiner* — Cynthia Britt
(74) *Attorney, Agent, or Firm* — Egan Peterman Enders Huston (57) ABSTRACT

Systems and methods are provided that may be implemented to detect and optionally recover corrupted system configuration data written to non-volatile random access memory (NVRAM). The disclosed systems and methods may be implemented by writing a copy of the NVRAM data to volatile system memory (e.g., RAM) while the system is active. Error correction code (ECC) data may written to the NVRAM when the system enters a lower power state. When the system resumes from the low power state, the copy of data is made in system RAM from the NVRAM, and the ECC data is used to determine whether there are errors in NVRAM data, in which case the ECC data may be used to correct data in the copy on RAM before writing the corrected data to NVRAM from the system RAM.

20 Claims, 6 Drawing Sheets

(51) Int. Cl.
  *G11C 29/52*      (2006.01)
  *G06F 3/06*       (2006.01)
  *G06F 1/3234*     (2019.01)
  *G06F 11/14*      (2006.01)

(52) U.S. Cl.
  CPC ........ *G06F 3/0679* (2013.01); *G06F 11/0772* (2013.01); *G06F 11/1044* (2013.01); *G06F 11/1068* (2013.01); *G06F 11/1471* (2013.01); *G11C 29/52* (2013.01)

(58) Field of Classification Search
  CPC .............. G06F 1/3275; G06F 11/1044; G06F 11/1471; G11C 29/52
  See application file for complete search history.

(56) References Cited

U.S. PATENT DOCUMENTS

| | | | | |
|---|---|---|---|---|
| 8,166,366 | B1* | 4/2012 | Trimberger | G06F 11/10 714/725 |
| 10,303,386 | B2* | 5/2019 | Blicharski | G06F 3/0625 |
| 2004/0255106 | A1* | 12/2004 | Rothman | G06F 11/1417 713/1 |
| 2004/0260678 | A1* | 12/2004 | Verbowski | G06F 11/008 |
| 2006/0149859 | A1* | 7/2006 | Dubal | G06F 1/24 710/8 |
| 2006/0220847 | A1* | 10/2006 | Lanigan | G07C 9/00166 340/545.6 |
| 2007/0011578 | A1* | 1/2007 | Lewis | G06F 11/1008 714/763 |
| 2007/0094420 | A1* | 4/2007 | Holm | G06F 21/71 710/8 |
| 2007/0234104 | A1* | 10/2007 | Shih | G06F 11/1417 714/6.12 |
| 2008/0183981 | A1* | 7/2008 | Tannai | A61B 1/00057 711/154 |
| 2008/0258758 | A1* | 10/2008 | Kaizu | G06F 11/1068 326/38 |
| 2009/0031194 | A1* | 1/2009 | Bellipaddy | G06F 11/1052 714/764 |
| 2010/0106809 | A1* | 4/2010 | Grohman | B60H 1/00642 709/220 |

OTHER PUBLICATIONS

Y. Pan, Y. Li, H. Sun, W. Xu, N. Zheng and T. Zhang, "Exploring the Use of Emerging Nonvolatile Memory Technologies in Future FPGAs," in IEEE Transactions on Very Large Scale Integration (VLSI) Systems, vol. 21, No. 4, pp. 771-775, Apr. 2013. (Year: 2013).*

Micron, "Error Correction Code (ECC) in Micron Single-Level Cell (SLC) Nand", TN-29-63 Error Correction Code (ECC) IN SLC Nand Introduction, Technical Note, Dowloaded Apr. 2, 2018, 12 pgs.

Sert Data Recovery, What is Ecc Error Correcting Code in Flash IN Sert Data Recovery, Downloaded Apr. 2, 2018, 5 pgs.

HP, "Master Boot Record Save/Restore BIOS Feature for HP Business Notebooks and Desktops", Technical White Paper, Aug. 2012, 6 pgs.

Free CCNA Study Guide, "3-7 Saving, Erasing, Restoring and Backing Up Configuration & IOS File", Captured from Internet on Jan. 16, 2018; 3 pgs.

Cisco, "Maintaining System Memory Configuraton Guide, Cisco IOS Release 15M&T", Jan. 2018, 33 pgs.

* cited by examiner

SYSTEMS AND METHODS FOR DETECTING ERRORS AND/OR RESTORING NON-VOLATILE RANDOM ACCESS MEMORY USING ERROR CORRECTION CODE

FIELD

This invention relates generally to information handling systems and, more particularly, to non-volatile random access memory (NVRAM) in information handling systems.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

On an information handling system, non-volatile random access memory (NVRAM) stores critical system configuration data. If this data is corrupted, or not up-to-date, the system will misbehave and may fail catastrophically. Currently on Unified Extensible Firmware Interface (UEFI) Basic Input/Output System (BIOS) systems, there is no validation of the contents of this data. So when it becomes corrupted, there is no way to detect or correct it.

Flash memory parts are typically used to store the system configuration data for information handling systems. Such flash memories tend to incur permanent damage to blocks after a generally known number of write/erase cycles, also known as program/erase (PE) cycles (e.g., 100,000).

SUMMARY

Disclosed are systems and methods that may be implemented to detect and optionally recover corrupted data stored in NVRAM of an information handling system, e.g., to detect and/or recover corrupted system configuration data (e.g., UEFI variables) stored in the NVRAM (e.g., flash memory). The disclosed systems and methods may be implemented in one embodiment without changing the NVRAM format, e.g., such as would be the case if Cyclic Redundancy Check (CRC) data was added to the NVRAM format. This is advantageous since many software components depend on the NVRAM format to remain unchanged, and it is therefore undesirable in some embodiments to add Cyclic Redundancy Check (CRC) data or make other changes to the NVRAM format. In a further embodiment, the disclosed systems and methods may be implemented to correct detected NVRAM errors, a capability which is not possible with CRC. The disclosed systems and methods may also be implemented in one embodiment without requiring a second (backup) copy of NVRAM data which would add to the bill of materials (BOM) cost for an information handling system.

In one exemplary embodiment, a copy of the NVRAM system configuration data may be stored in a volatile random access memory (RAM), e.g., when the system boots up or resumes from a low power state. As the system enters a low power state (e.g., shutdown, reboot, sleeping state, etc.) in which the power may be removed from the RAM, Error Correcting Code (ECC) data of the system configuration data is calculated (as well as the CRC of the ECC data) and written to the NVRAM. In this embodiment, ECC does not change format of the NVRAM. Requests to write to the system configuration data are written to both the NVRAM and the copy in RAM, without updating the ECC data. Requests to read the system configuration data are satisfied from the copy in RAM. When the system resumes from the low power state, the copy is made in the RAM from the NVRAM, the ECC data is used to determine whether there are errors in the system configuration data, and, if so, the ECC data is used to correct the copy on RAM. If the correction succeeds, the NVRAM may be written with the corrected system configuration data from the RAM. Corrections are logged in an event log. If the system configuration data is uncorrectable, a default version of the system configuration data is loaded as a security measure.

In one exemplary embodiment, before the system enters a low power state (e.g., such as warm boot, cold boot, hibernation, and standby), the system BIOS (e.g., UEFI) or other suitable executing code calculates ECC data and a CRC of the ECC data for each NVRAM block of data that is stored as a copy in system RAM. The BIOS then copies the current ECC data in RAM and the CRC to the NVRAM device (e.g., flash part) and sets a bit indicating the ECC data is up-to-date. When the system resumes from a low power state or on a boot cycle, the NVRAM data is copied from NVRAM to RAM/Cache and the ECC corrections are applied to the RAM copy if the ECC-up-to-date bit is set. If any NVRAM failures are detected by the ECC data, then a flag is set to indicate the NVRAM data is to be updated on the NVRAM (e.g., flash part) part after a flash part or other NVRAM writing protocol is available to the BIOS, and the failure occurrence may be written to the event log. Thereafter, when the NVRAM is written to during normal system operation, the data is written to the RAM/Cache buffer in addition to the NVRAM (e.g., flash part), and the ECC-up-to-date bit is cleared. When data corresponding to NVRAM data is read by code executing on a host processing device or other processing device, it is read from the RAM/Cache copy of the NVRAM data instead of from the NVRAM device (e.g., flash part) itself, thus reducing the boot time as well as SMI-based NVRAM access latency.

One or more of the following additional advantages may be made possible or realized in the above-described embodiment. An automatic integrity check of NVRAM variables may be accomplished. NVRAM data may be automatically corrected even when the NVRAM blocks are permanently damaged. PEI, DXE, and Runtime variable services may also make use the corrected NVRAM data. Additionally, system reliability may be improved as system failures (e.g., "no power/no POST" failures) may be reduced, resulting in significant cost savings because the number of motherboard replacements in the field may be reduced. Because the ECC is created and written to the NVRAM only when the system enters low power state (S3, S4, S5) and reboots, wear on NVRAM parts is reduced. System boot time may be reduced because NVRAM variable reads are from the RAM/Cache buffer. Finally, the advantages may be accomplished without having to change the format of the NVRAM data and without adding a second copy of the data in NVRAM that would increase the system bill of materials cost by.

Thus, NVRAM corruption recovery may be provided in one embodiment and used to reduce the number of system failures due to corruption of system configuration data, e.g., due to NVRAM failure (e.g., due to excessive write/erase cycles), which may further advantageously result in a reduction in the number of service calls to repair and/or replace the system or components thereof. Although the number of writes to the NVRAM may be increased by the NVRAM corruption recovery methodology, because the ECC data is only written when the system transitions to a lower power state rather than each time the system updates a system configuration data variable, the increase in the number of times the ECC data is written to the NVRAM is relatively small, which may avoid exacerbating the problem of damaging flash memory parts by writing to them excessively. Further advantageously, NVRAM corruption recovery may improve system boot time and the execution of other system software that frequently accesses the system configuration data. Finally, NVRAM corruption recovery may advantageously be used to improve system security by detecting unauthorized updates to system configuration data.

In one respect, disclosed herein is an information handling system, including a non-volatile random access memory (NVRAM) configured to store system configuration data, a volatile random access memory (RAM) configured to store a copy of the system configuration data, and a processing device. The processing device may be programmed to, in response to a request to put the system into a low power state, generate ECC data of at least the system configuration data and write the ECC data to the NVRAM. The processing device may also be programmed to, in response to a request to resume the system from the low power state, read the system configuration data from the NVRAM and write it to the RAM to create the copy. The processing device may also be programmed to use the ECC data to determine whether the copy is corrupted and, if so, use the ECC data to correct the copy.

In one respect, disclosed herein is a method, including using at least one processing device of an information handling system having a non-volatile random access memory (NVRAM) configured to store system configuration data and a volatile random access memory (RAM) configured to store a copy of the system configuration data to, in response to a request to put the system into a low power state, generate ECC data of at least the system configuration data and write the ECC data to the NVRAM. The method further includes using the at least one processing device to, in response to a request to resume the system from the low power state, read the system configuration data from the NVRAM and write it to the RAM to create the copy, use the ECC data to determine whether the copy is corrupted and, if so, use the ECC data to correct the copy.

DESCRIPTION OF ILLUSTRATIVE EMBODIMENTS

Figure 1:
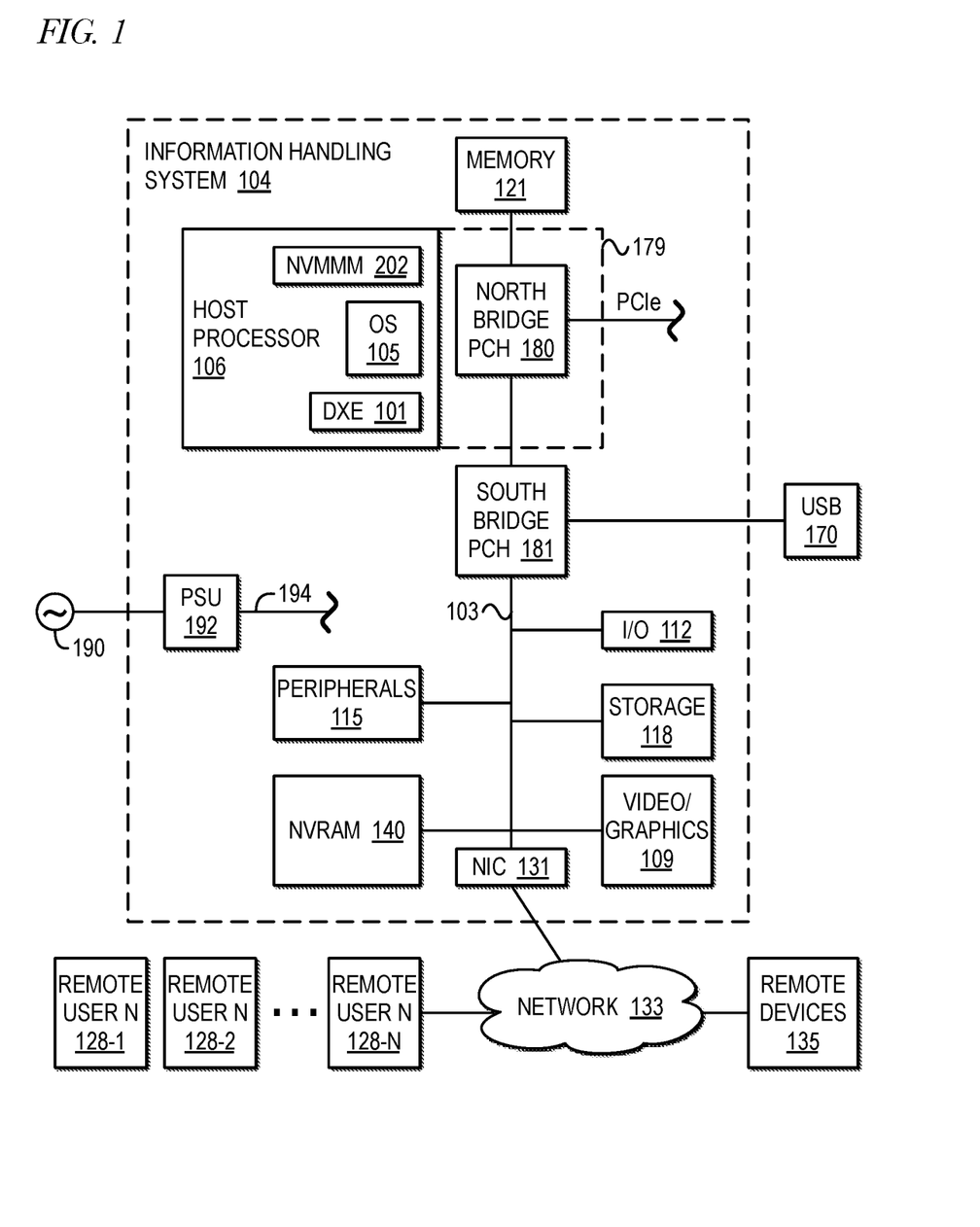
FIG. 1 illustrates a block diagram of an information handling system according to one exemplary embodiment of the disclosed systems and methods.

FIG. 1 is a block diagram of an information handling system 104 (e.g., such as a server, desktop computer, laptop, etc.) as it may be configured according to one exemplary embodiment. As shown, system 104 may include one or more host processing device/s 106 (e.g., AMD or Intel-based CPU such as Itanium or any other type of suitable host processing device), one or more buses or communication media 103 (e.g., PCIe bus, USB, SMBus, SATA, other appropriate data buses such as memory bus, etc.), video/graphics hardware 109 (e.g., video adapter or graphics processor unit), storage 118 (e.g., hard disk drive and/or optical drive, etc.), system volatile memory 121 (e.g., DRAM), local input/output (I/O) 112, peripherals 115 (e.g., keyboard, mouse, etc.), and remote access controller (RAC) (not shown). Examples of a remote access controller include an integrated Dell Remote Access Controller (iDRAC) available from Dell Products L.P. of Round Rock, Tex., etc.). In the exemplary embodiment of FIG. 1, host processing device/s 106 is configured to load and run UEFI (with DXE loader 101 as shown), host OS 105 (e.g., Windows-based OS, Linux-based OS, etc.), and NVRAM management module (NVMMM) 202 (of FIG. 2), among others.

Bus/es 103 provides a mechanism for the various components of system 104 to communicate and couple with one another. As shown, host processing device/s 106 may be coupled in an embodiment to bus/es 103 via hostbridge 180 that may be a separate component (e.g., such as a Northbridge chip) or its functions may be integrated within host processing device 106 as illustrated by dashed line 179 in FIG. 1. In either case, hostbridge 180 is directly coupled to system memory 121 as shown, while hostbridge 180 may be coupled through a separate Southbridge chip (or platform controller hub "PCH" chip) 181 to facilitate input/output functions for the processing device/s 106 with various internal system components of information handling system 104 through bus/es 103 such as PCI, PCIe, SPI, USB, low pin count (LPC), etc. Examples of such system components that may be accessed through Southbridge/PCH 181 with DMA include, but are not limited to, NVRAM 140, BIOS SPI Flash, NVDIMMS, DIMMS, PCIe Devices, etc.

In one embodiment, host processing device/s 106 may be an in-band processing device configured to run a host operating system (OS) 105. Besides memory 121 (e.g., random access memory "RAM"), processor 106 may include cache memory for storage of frequently accessed data. Information handling system 104 may also include a network access card (NIC) 131 that is communicatively coupled to network 133 (e.g., Internet or corporate intranet) as shown to allow various components of system 104 to communicate with external and/or remote device/s 135 across network 133. Other external devices, such as an external universal serial bus (USB) device 170 may be coupled to processing device/s 106 via Southbridge/PCH 181. In this embodiment, information handling system 104 also includes power supply unit (PSU) 192 that is coupled to receive power from AC mains 190 and to perform appropriate power conversion and voltage regulation to produce regulated internal power 194 for use by other power-consuming components of system 104.

Figure 2:
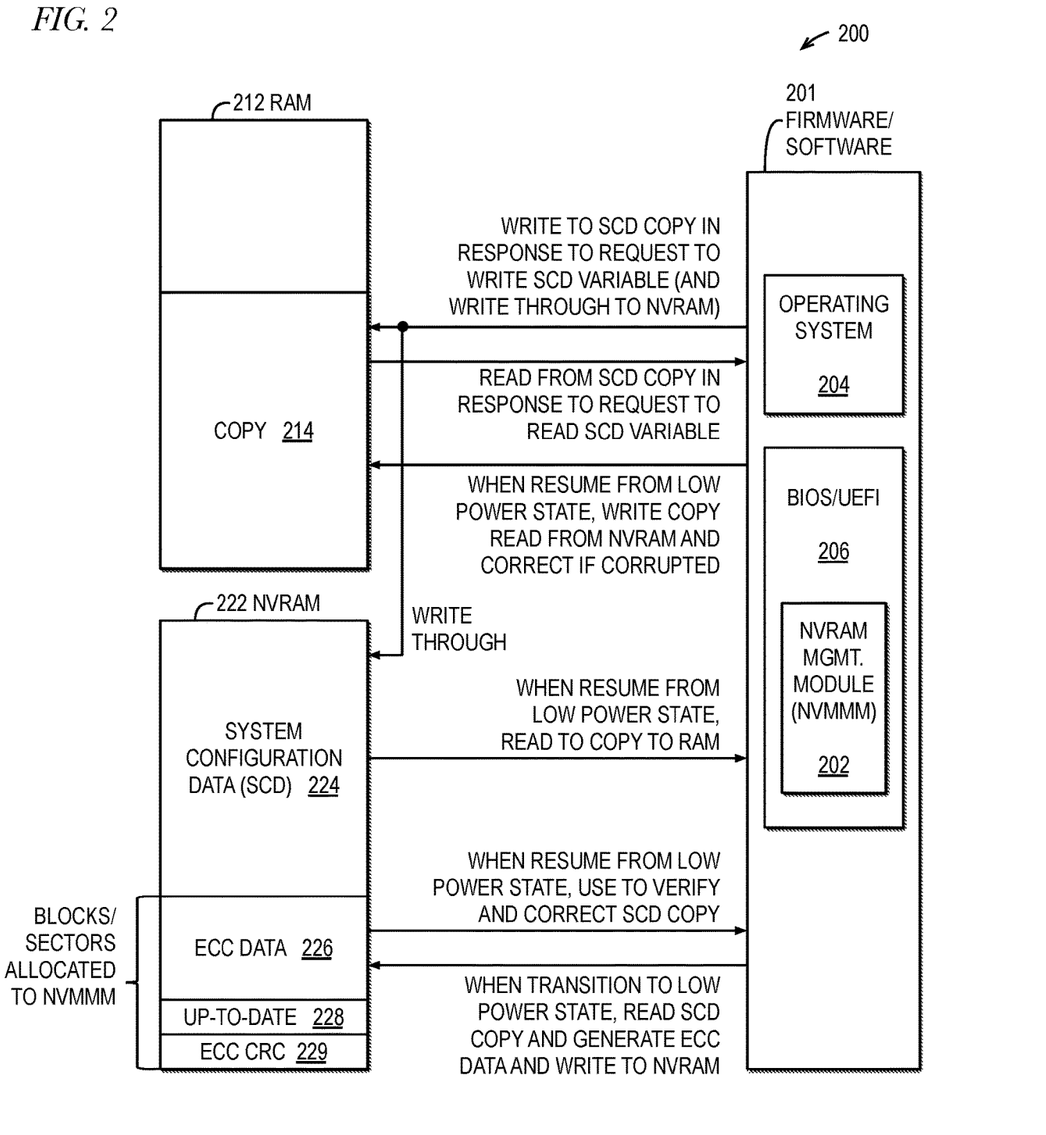
FIG. 2 illustrates a block diagram of portions of an information handling system which performs NVRAM corruption recovery according to one exemplary embodiment of the disclosed systems and methods.

Still referring to FIG. 1, host processing device/s 106 is coupled to NVRAM 140 (e.g., embedded and partitioned flash memory, Electrically Erasable Programmable Read Only Memory—EEPROM, other types of non-volatile random access memory "NVRAM", etc.) that is configured to store persistent information for system components, e.g., including UEFI firmware and/or BIOS 206 (of FIG. 2). As described in more detail below, the NVRAM 140 may be configured to store system configuration data (SCD), such as UEFI variables, Advanced Configuration and Power Interface (ACPI) information, and/or other system BIOS firmware (e.g., in the form of system management SMBIOS data), etc. It will be understood that system NVRAM 140 may be implemented by one or more NVRAM storage devices, such as flash memory devices. In this embodiment, system 104 may also include a baseboard management controller (BMC) (not shown). As shown, in the embodiment of FIG. 1 the host system 104 may provide access to a plurality of remote users 128-1 through 128-N, although access may be provided to a single user 128 in other embodiments. In this regard, remote users many manage, administer, use, and/or access various resources of host system 104 (e.g., either native or virtual) from a remote location, e.g., via network 133 and/or other suitable communication medium or media.

It will be understood that the embodiment of FIG. 1 is exemplary only, and that an information handling system may be provided with one or more processing devices that may perform the functions of host processing device/s 106, etc. Examples of such processing devices include, but are not limited to, central processing units (CPUs), embedded controllers, microcontrollers, application specific integrated circuits (ASICs), field programmable gate arrays (FPGAs), etc. It will also be understood that the particular configuration of FIG. 1 is exemplary only, and that other information handling system architectures may be employed in the practice of the disclosed systems and methods.

It has been observed that corruption of NVRAM, e.g., flash memory, that stores system configuration data is a cause of a relatively large number of system failures annually, resulting in significant cost to the system manufacturer and dissatisfaction of users. Embodiments are described herein that provide systems and methods for recovering from NVRAM failures by detecting corruption of the system configuration data and/or correcting it thereby improving system reliability and reducing the number of system failures. The embodiments may be implemented to save ECC data generated from the system configuration data to the NVRAM and use the ECC data to detect and correct corruption when needed. Advantageously, the embodiments may also be implemented to minimize the number of times the ECC data is written to the NVRAM which may avoid exacerbating the problem of damaging flash memory parts by writing to them excessively. Further advantageously, the embodiments may improve system boot time and the execution of other system software that frequently accesses the system configuration data, such as system management mode (SMM) code, because a copy of the system configuration data is stored in random access memory (RAM) that may have a lower access latency than the NVRAM.

FIG. 2 is a block diagram of portions of an information handling system 200, such as portions of information handling system 104 of FIG. 1, which performs NVRAM corruption recovery. System 200 includes a volatile RAM 212, a NVRAM 222, and system firmware/software 201. NVRAM 222 stores system configuration data 224, ECC data 226, an ECC up-to-date flag 228, and an ECC CRC 229. RAM 212 stores a copy 214 of the system configuration data 224. RAM 212 may be system memory 121 of FIG. 1 or any other suitable volatile RAM. NVRAM 222 may be NVRAM 140 of FIG. 1 or any other suitable NVRAM, such as an SPI flash memory. System firmware/software 201 may include an operating system 204 (e.g., OS 105 of FIG. 1) and a BIOS 206 (e.g., UEFI), which may include a NVRAM management module (NVMMM) 202. In one embodiment NVMMM 202 may be executed as part of BIOS 206 (e.g., UEFI or other system BIOS). Preferably, NVMMM 202 comprises firmware and/or software that executes on a processing device, such as host processing device/s 106 of FIG. 1. Preferably, the NVMMM 202 is allocated (e.g., by the system firmware during the boot process) a group of sectors, or blocks, of the NVRAM 222 for storing the ECC data 226, ECC up-to-date flag 228, and ECC CRC 229, as shown. The remainder of the NVRAM 222 stores the system configuration data 224 and may also store other data and/or code.

Preferably, operating system 204 and/or system BIOS 206 is in communication with NVMMM 202, e.g., to request NVMMM 202 to read and write system configuration data 224 and to inform NVMMM 202 that the system will be placed into a low power state, e.g., shutdown, reboot or transition to a sleeping state, as described in more detail below. When system 200 resumes from a low power state, e.g., boot up or resume from a sleeping state, NVMMM 202 reads system configuration data 224 from NVRAM 222 and writes it to RAM 212 to create copy 214. NVMMM 202 also reads ECC data 226 and uses it to verify copy 214 of system configuration data 224 and to correct copy 214 as necessary, as described in more detail below. When system 200 transitions to a low power state, e.g., reboot or to a sleeping state, NVMMM 202 generates ECC data of copy 214 and writes ECC data 226 to NVRAM 222 for later use upon resumption from the low power state. Preferably, NVMMM 202 provides an interface, such as an applications programming interface (API), by which operating system 204 and/or BIOS 206 may make requests to access system configuration data 224. More specifically, when OS/BIOS 204/206 requests to read a portion of system configuration data 224, NVMMM 202 reads the portion (e.g., UEFI variable) from copy 214 in RAM 212, rather than from NVRAM 222. In this respect, RAM 212 effectively operates as a cache of system configuration data 224 stored in NVRAM 222. Conversely, when OS/BIOS 204/206 requests to write a portion of system configuration data 224, NVMMM 202 writes the specified data both to copy 214 in RAM 212 and also writes through to system configuration data 224 in NVRAM 222. In this respect, RAM 212 effectively operates as a write-though cache. This is described in more detail below with respect to FIGS. 4 through 7.

Generally, ECC data is redundant data (e.g., parity bits) generated from original data. The original data is the data whose integrity the system attempts to ensure, i.e., to protect from corruption. The original data is what the system writes to memory, and the system needs to read back the same value of the original data that it wrote. The original data value may be corrupted in the memory, e.g., by a cosmic ray (e.g., gamma ray) or alpha particle released from radioactive decay of semiconductor material that changes the state of a memory cell. Flash memories, as well as other non-volatile memory technologies based on floating gate technology, may also experience data corruption due to an excessive number of write/erase cycles, as mentioned above. (Or, in the case of data transmission, the original data is what a transmitter transmits, and the system needs the receiver to receive the same value of the original data that was transmitted. In such case, the original data is typically corrupted by noise.) The ECC data enables an entity that reads the original data from the memory to which it was written to detect errors (i.e., corruption) in the data value read and to correct the errors so that the original data value is obtained, depending upon the number of errors. The number of errors (e.g., bit errors) that may be detected and the number of errors that may be corrected depends upon the amount of redundant data used and the algorithms employed to generate and use the ECC data.

To generate the ECC data, an ECC generator performs an algorithm on the original data to generate the ECC data as output. In some embodiments, the ECC data is calculated on a row-column basis. With respect to FIG. 2, the ECC data 226 enables the NVMMM 202 to detect a limited number of errors that may occur in the system configuration data and to correct a limited number of the errors detected. This may be advantageous because it has been observed that a relatively large number of system failures occur due to corruption of the system configuration data. The system failures may result in a relatively large number of service calls to repair and/or replace the system or components thereof, such as the NVRAM that stores the system configuration data or a circuit board upon which the NVRAM resides. Examples of well-known ECC data generation methods are Hamming codes and triple modular redundancy codes, although other embodiments are contemplated that employ multidimensional parity-check codes, Reed-Solomon codes, turbo codes, or low-density parity-check codes (LDPC). These and any other suitable ECC data generation methods may be employed in the embodiments described. In one embodiment, the ECC data 226 enables the detection of up to two bits and correction of up to one bit per 8-byte quad-word and of up to eight bytes per 4 KB block. In another exemplary embodiment, ECC data 226 may enable correction of 1 bit errors in a 4 k Advanced Format Sector. It will be understood that in one embodiment the maximum number of correctable bits will be limited by the ECC data size used. If data is processed in 32 bit chunks, up to 32 errors aligned with that chunk size may be corrected. If data is processed in 64 bit chunks, up to 64 errors aligned with that chunk size may be corrected. It will be understood that the preceding values are exemplary only and greater or lesser number of bit errors may be detected and/or corrected in other embodiments.

Figure 3:
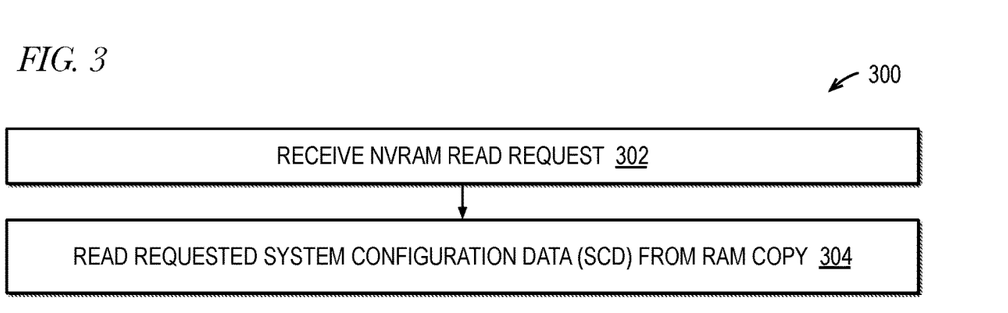
FIG. 3 illustrates NVRAM system configuration data read methodology, according to one exemplary embodiment of the disclosed systems and methods.

FIG. 3 illustrates an aspect of NVRAM corruption recovery methodology, namely a system configuration data read methodology 300, that may be performed by executing NVMMM 202 of FIG. 2 on host processing device/s 106 of FIG. 1. It will be understood that methodology 300 is described in relation to FIG. 1 and FIG. 2 for purposes of illustration only, and that methodology 300 (as well as methodologies 400 through 700 of FIGS. 4 through 7) may be implemented by at least one information handling system processing device with any other suitable combination of information handling system components for executing NVRAM corruption recovery. Methodology 300 flow begins at block 302.

At block 302, NVMMM 202 receives a request to read a portion of system configuration data 224. For example, operating system 204 or BIOS 206 may request to read a UEFI variable. Flow proceeds to block 304.

At block 304, NVMMM 202 reads the requested portion of system configuration data 224 from copy 214 in RAM 212 and returns the value read to the requesting code. Flow ends at block 304.

An advantage of methodology 300 is that RAM 212 may be read faster than NVRAM 222, generally speaking. For example, in one embodiment the time required to read a system configuration data variable from RAM 212 is on the order of hundreds of microseconds, whereas the time required to read a system configuration data variable from NVRAM 222 is on the order of tens of milliseconds. This may significantly speed up operation of system software that reads system configuration data variables relatively frequently, such as system boot code or system management mode (SMM) code executed in response to a system management interrupt (SMI). For example, system software may engage in data collection for telemetry purposes of the system configuration data involving a relatively large number of reads from the system configuration data; in such cases methodology 300 may result in a significantly reduced latency.

Figure 4:
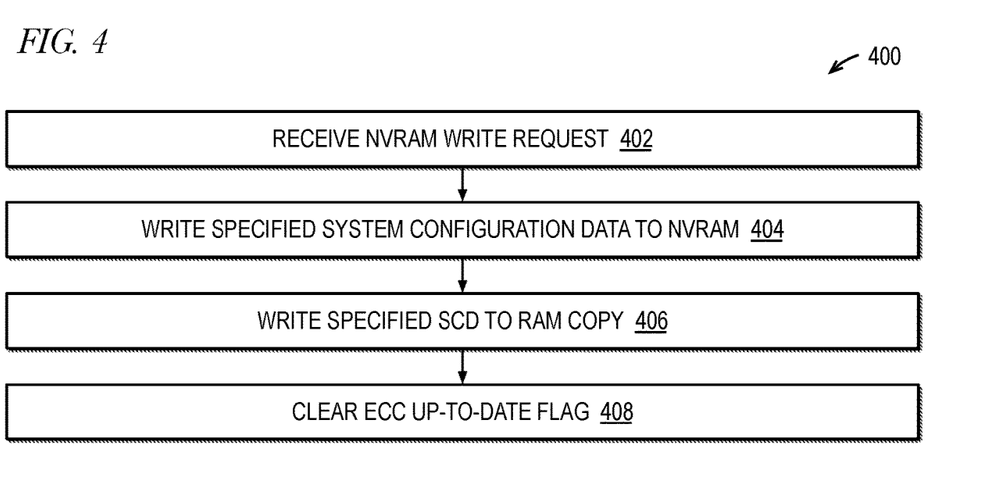
FIG. 4 illustrates NVRAM system configuration data write methodology according to one exemplary embodiment of the disclosed systems and methods.

FIG. 4 illustrates an aspect of NVRAM corruption recovery methodology, namely a system configuration data write methodology 400, that may be performed by executing NVMMM 202 of FIG. 2 on host processing device/s 106 of FIG. 1. Methodology 400 flow begins at block 402.

At block 402, NVMMM 202 receives a request to write a portion of system configuration data 224. For example, operating system 204 or BIOS 206 may request to write a UEFI variable. Flow proceeds to block 404.

At block 404, NVMMM 202 writes the specified value to the specified portion of system configuration data 224 in NVRAM 222. Flow proceeds to block 406.

At block 406, NVMMM 202 writes the specified value to the specified portion of system configuration data 224 in copy 214 in RAM 212. Flow proceeds to block 408.

At block 408, NVMMM 202 clears ECC up-to-date flag 228 to indicate that data has been written to NVRAM 232 since ECC data was last generated for the data on NVRAM 232. Preferably, NVMMM 202 reads the value of ECC up-to-date flag 228 first and if it is already cleared, NVMMM 202 refrains from actually writing ECC up-to-date flag 228, which may advantageously reduce the number of write operations to NVRAM 222. Flow ends at block 408. As described below with respect to FIG. 5, advantageously NVMMM 202 does not update ECC data 226 upon each write of system configuration data 224.

Figure 5:
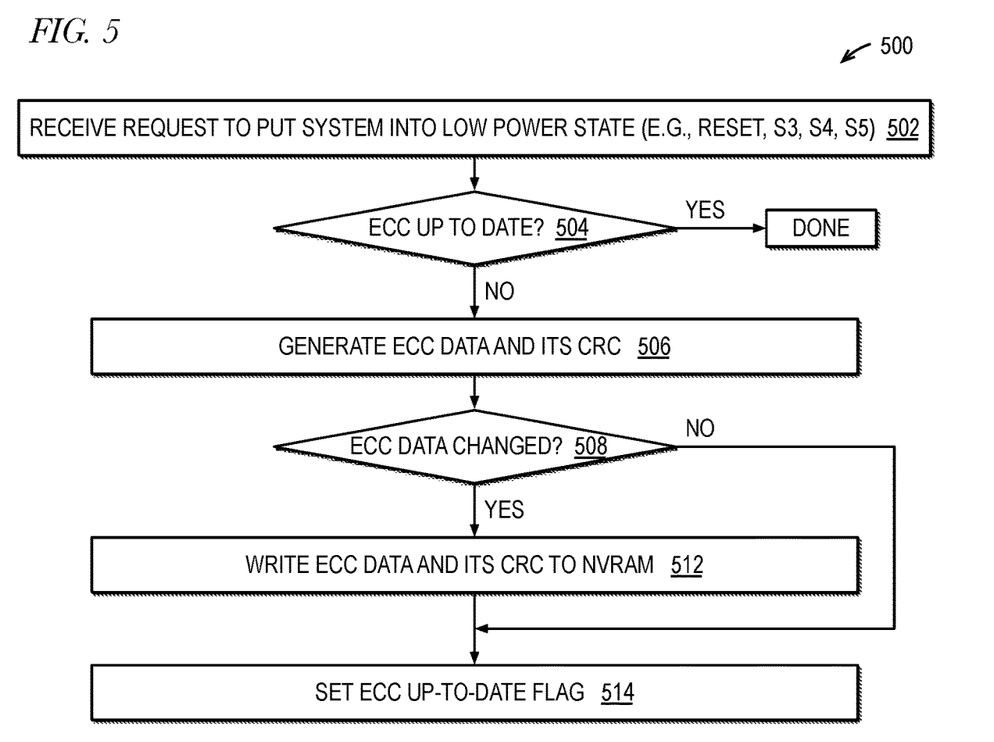
FIG. 5 illustrates a methodology for generating and writing ECC data to NVRAM according to one exemplary embodiment of the disclosed systems and methods.

FIG. 5 illustrates an aspect of NVRAM corruption recovery methodology, namely a methodology 500 for generating and writing ECC data 226 to NVRAM 222, that may be performed by executing NVMMM 202 of FIG. 2 on host processing device/s 106 of FIG. 1. Methodology 500 flow begins at block 502.

At block 502, NVMMM 202 receives a request to put system 200 into a low power state. Preferably, a low power state is a state in which the contents of RAM 212 will be lost, e.g., power is removed from RAM 212. For example, the request may be to power down system 200, reset system 200, or transition system 200 to a sleeping state, such as the well-known Advanced Configuration and Power Interface (ACPI) S3, S4, or S5 sleeping states. Flow proceeds to decision block 504.

At decision block 504, NVMMM 202 reads ECC up-to-date flag 228 to determine whether ECC data 226 is up to date for all data currently written and stored on NVRAM 232. If so, flow ends since the ECC data is already updated; otherwise, flow proceeds to block 506.

At block 506, NVMMM 202 reads system configuration data 224 from NVRAM 222 and generates its ECC data. NVMMM 202 then calculates a checksum (e.g., CRC) of the generated ECC data. Preferably, NVMMM 202 generates the ECC data and CRC and temporarily stores them in RAM 212. Preferably, NVMMM 202 generates ECC data for each NVRAM 222 block that is storing system configuration data 224. In one embodiment, NVMMM 202 generates ECC data for all NVRAM 222 blocks that are not allocated to NVMMM 202, as shown in FIG. 2, which may include other data and/or code than system configuration variables, e.g., BIOS code. Flow proceeds to decision block 508.

At decision block 508, NVMMM 202 determines whether ECC data 226 in NVRAM 222 has changed. In one embodiment, NVMMM 202 reads ECC data 226 from NVRAM 222 and compares it with the ECC data generated at block 506 to determine whether ECC data 226 has changed. In another embodiment, NVMMM 202 reads CRC 229 stored in NVRAM 222 and compares it with the CRC generated at block 506 to determine whether ECC data 226 has changed. If ECC data 226 has not changed, flow proceeds to block 514 without writing ECC data from step 506 to NVRAM 222; otherwise, flow proceeds to block 512.

At block 512, NVMMM 202 writes the ECC data generated at block 506 to ECC data 226 in NVRAM 222 and writes the CRC generated at block 506 to CRC 229 in NVRAM 222. Flow proceeds to block 514.

At block 514, NVMMM 202 sets ECC up-to-date flag 228. Flow ends at block 514.

An advantage of writing ECC data 226 to NVRAM 222 only when transitioning to a low power state (e.g., warm boot, cold boot, hibernation, standby) as in methodology 500, rather than each time the system configuration data is updated, is that it reduces the number of times NVRAM 222 is written. This may be important when NVRAM 222 is implemented as a flash memory device that has a limited number of write/erase cycles.

Figure 6:
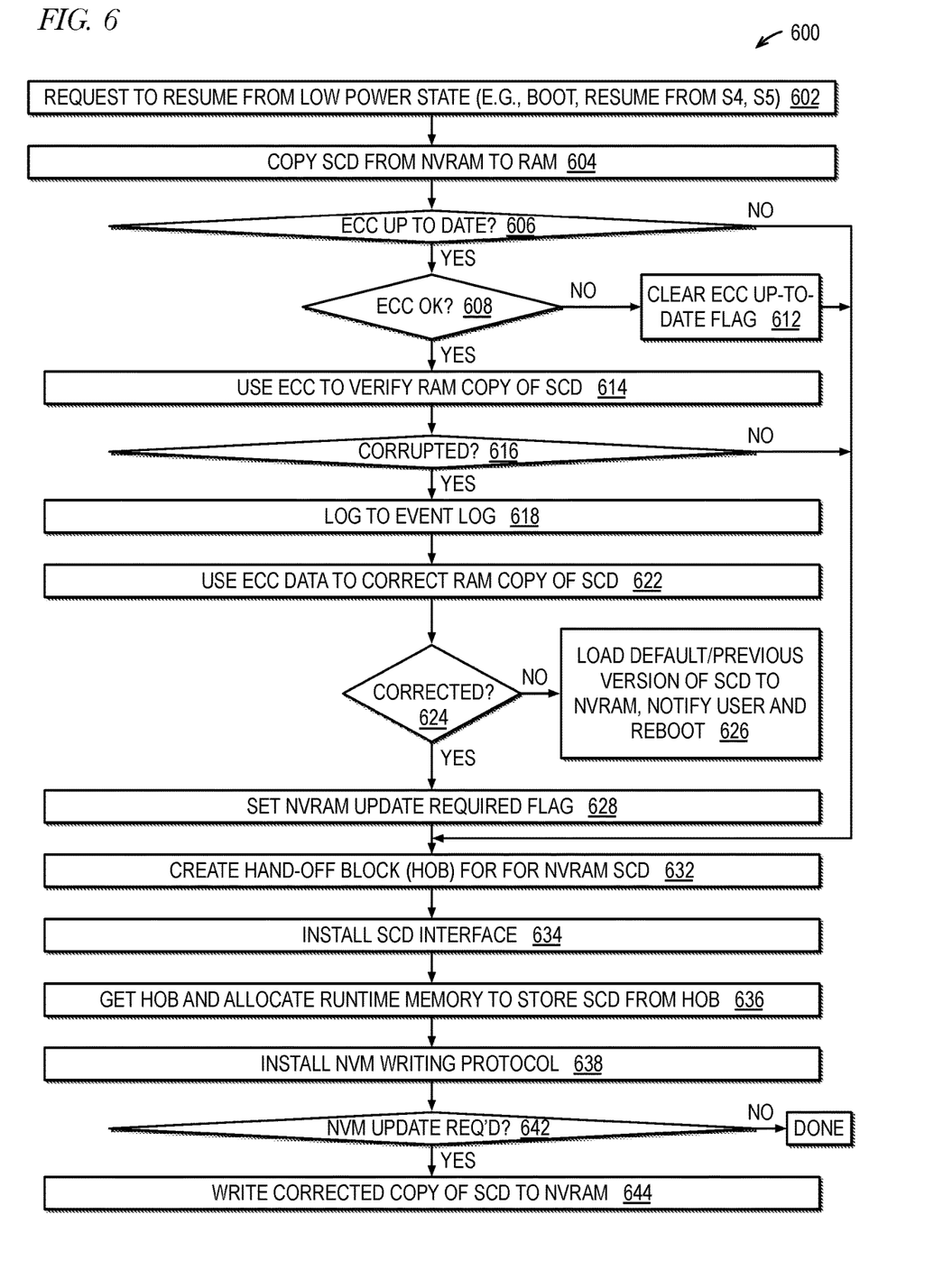
FIG. 6 illustrates NVRAM corruption recovery methodology according to one exemplary embodiment of the disclosed systems and methods.

FIG. 6 illustrates a NVRAM corruption recovery methodology 600 that may be performed by executing NVMMM 202 of FIG. 2 on host processing device/s 106 of FIG. 1. Methodology 600 flow begins at block 602.

At block 602, NVMMM 202 receives a request to resume operation from a low power state. For example, the request may be to boot up system 200 or resume system 200 from a sleeping state, such as the ACPI S4 or S5 sleeping states. It is noted that a separate methodology 700 is described below with respect to FIG. 7 for resuming from a less deep sleeping state, e.g., ACPI S3. Flow proceeds to block 604.

At block 604, NVMMM 202 copies system configuration data 224 from NVRAM 222 to RAM 212. In one embodiment, NVMMM 202 copies all NVRAM 222 blocks that are not allocated to NVMMM 202, as shown in FIG. 2, which may include other data and/or code than system configuration variables, e.g., BIOS code. Flow proceeds to decision block 606.

At decision block 606, NVMMM 202 reads ECC up-to-date flag 228 to determine whether ECC data 226 is up to date. If not, flow proceeds to block 632; otherwise, flow proceeds to decision block 608.

At decision block 608, NVMMM 202 verifies the integrity of ECC data 226. Preferably, NVMMM 202 reads ECC data 226, computes its CRC, and compares the computed CRC with CRC 229 read from the NVRAM 222. If ECC data 226 is corrupted, flow proceeds to block 612; otherwise, flow proceeds to block 614.

At block 612, NVMMM 202 clears ECC up-to-date flag 228. Flow proceeds to block 632.

At block 614, NVMMM 202 uses ECC data 226 to determine whether copy 214 in RAM 212 is corrupted. Copy 214 may be corrupted, for example, because of a failure (e.g., a bit failure) in NVRAM 222 such that a value of system configuration data 224 read from NVRAM 222 at block 604 to make copy 214 was corrupted, i.e., the value read is not the same as the value most recently written to system configuration data 224, e.g., at block 404 of FIG. 4. Flow proceeds to decision block 616.

At decision block 616, if copy 214 is corrupted (which implies system configuration data 224 in NVRAM 222 is corrupted), flow proceeds to block 618; otherwise, flow proceeds to block 632.

At block 618, NVMMM 202 logs the detection of the corruption of system configuration data 224 to a system event log. This may advantageously enable other system software to track the health of NVRAM 222. Flow proceeds to block 622.

At block 622, NVMMM 202 uses ECC data 226 to attempt to correct copy 214. Flow proceeds to decision block 624.

At decision block 624, NVMMM 202 determines whether it was able to correct copy 214 at block 622 using ECC data 226. If so, flow proceeds to block 628; otherwise, flow proceeds to block 626.

At block 626, NVMMM 202 loads a default version of the system configuration data (e.g., from system BIOS code area) into NVRAM 222 and then reboots system 200. For example, the default version may be a factory version with which system 200 is configured when manufactured, e.g., prior to modification by the user of system 200. Alternatively, NVMMM 202 loads a user default version which is previous version of the system configuration data specified by the user as a known good (e.g., uncorrupted) version. In one embodiment, system 200 further notifies the user (e.g., via a video display) that an error occurred, e.g., that system 200 detected corruption of system configuration data 224 and was unable to correct the corruption, and that a default value or a previous value of the system configuration data is being loaded. In one embodiment, system 200 asks the user whether the user wants to load the default version of the system configuration data and reboot the system before doing so.

As described herein, NVMMM 202 may in one embodiment provide a programming interface that includes a request to write/update the system configuration data (e.g., per FIG. 4). In response to a request to write the system configuration data, NVMMM 202 updates it in both NVRAM 222 and copy 214 in RAM 212. However, it should be noted that if a program (e.g., an unauthorized intruding program) writes NVRAM 222 directly to update system configuration data 224 outside BIOS 206 (e.g., without doing so via the programming interface provided by NVMMM 202), then copy 214 in RAM 212 is not updated. Consequently, ECC data 226 generated and written to the NVRAM 222 in response to a request to put the system into a low power state (e.g., as described with respect to FIG. 5)

does not reflect system configuration data 224 writes performed by the unauthorized program. Consequently, NVMMM 202 will detect (e.g., at decision block 616 of FIG. 6) that the copy 214 (and therefore the system configuration data 224) is corrupted and NVMMM 202 will not be able to correct copy 214 using ECC data 226. This inability to correct using ECC data 226 may be inferred as detection of a security breach. In response to occurrence of such an event the system may in one embodiment load a default version of the system configuration data and/or notify the user of the data correction failure and possible security breach, which may provide enhanced security for system 200.

At block 628, NVMMM 202 sets a flag to indicate system configuration data 224 in NVRAM 222 requires updating because it was detected as being corrupted and correctable. Flow proceeds to block 632.

At block 632, NVMMM 202 creates a hand-off block (HOB) for NVRAM 222 system configuration data 224. In one embodiment, an HOB is defined according to the Extensible Firmware Interface (EFI). In one embodiment, blocks 604 through 634 are performed during a Pre-EFI Initialization (PEI) phase of system 200 booting or resuming from a deep sleeping state, and blocks 636 through 644 are performed during a Driver eXecution Environment (DXE) phase of system 200 booting or resuming from a deep sleeping state. In such an embodiment, system 200 includes PEI Modules (PEIM), a DXE foundation, and DXE drivers. Flow proceeds to block 634.

At block 634, NVMMM 202 installs an interface that facilitates access to system configuration data. In one embodiment, installing an interface that facilitates access to system configuration data comprises installing a PEIM-to-PEIM Interface (PPI) that allows access to system configuration data. Flow proceeds to block 636.

At block 636, NVMMM 202 gets the HOB created at block 632 and allocates run-time memory to store the system configuration data from the HOB. Flow proceeds to block 638.

At block 638, NVMMM 202 installs a protocol that facilitates writing to NVRAM 222. In one embodiment, the protocol facilitates writing to NVRAM 222 by DXE drivers. Flow proceeds to decision block 642.

At decision block 642, NVMMM 202 determines whether system configuration data 224 in NVRAM 222 requires updating, e.g., because it was determined to be corrupted at decision block 616 and was determined to be correctable at block 624. If system configuration data 224 requires updating, flow proceeds to block 644; otherwise, flow ends.

At block 644, NVMMM 202 reads corrected copy 214 from RAM 212 and writes it to NVRAM 222. Flow ends at block 644.

Advantageously, by correcting corrupted system configuration data 224, system 200 may be able to continue to operate upon corrected system configuration data even when blocks of NVRAM 222 are permanently damaged, which may be common with flash memories.

Figure 7:
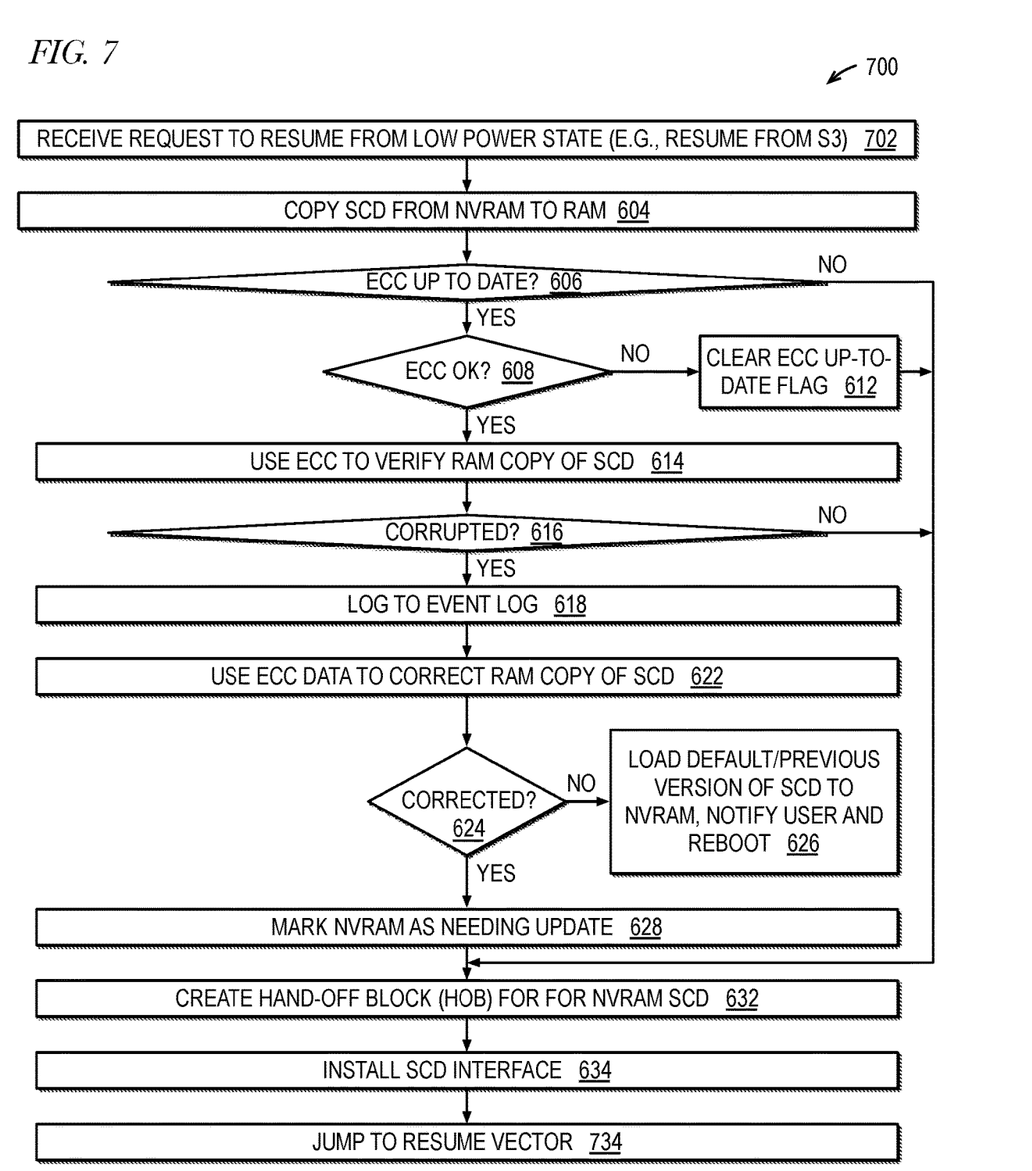
FIG. 7 illustrates NVRAM corruption recovery methodology according to one exemplary embodiment of the disclosed systems and methods.

FIG. 7 illustrates a NVRAM corruption recovery methodology 700 that may be performed by executing NVMMM 202 of FIG. 2 on host processing device/s 106 of FIG. 1. Methodology 700 of FIG. 7 is similar in many respects to methodology 600 of FIG. 6 and like-numbered elements are similar. Differences will now be described. Flow begins at block 702. At block 702, NVMMM 202 receives a request to resume operation from a low power state, but one which is a higher sleeping state than the low power states with respect to FIG. 6. For example, the request may be to resume system 200 from a sleeping state such as the ACPI S3 sleeping state. Flow proceeds from block 702 to block 604 and continues as with respect to FIG. 6 until block 634. From block 634, flow proceeds to block 734 at which NVMMM 202 jumps to a resume vector to resume running the system at the point it was running when it began to enter the low power state.

It will be understood that the steps of FIGS. 3 through 7 are exemplary only, and that any combination of fewer, additional and/or alternative steps may be employed that are suitable for performing NVRAM corruption detection and/or recovery using ECC data.

It will be understood that one or more of the tasks, functions, or methodologies described herein (e.g., including those described herein for components 106, 109, 131, 180, 181, 133, etc.) may be implemented by circuitry and/or by a computer program of instructions (e.g., computer readable code such as firmware code or software code) embodied in a non-transitory tangible computer readable medium (e.g., optical disk, magnetic disk, non-volatile memory device, etc.), in which the computer program comprising instructions are configured when executed on a processing device in the form of a programmable integrated circuit (e.g., processor such as CPU, controller, microcontroller, microprocessor, ASIC, etc. or programmable logic device "PLD" such as FPGA, complex programmable logic device "CPLD", etc.) to perform one or more steps of the methodologies disclosed herein. In one embodiment, a group of such processing devices may be selected from the group consisting of CPU, controller, microcontroller, microprocessor, FPGA, CPLD and ASIC. The computer program of instructions may include an ordered listing of executable instructions for implementing logical functions in an information handling system or component thereof. The executable instructions may include a plurality of code segments operable to instruct components of an information handling system to perform the methodologies disclosed herein.

It will also be understood that one or more steps of the present methodologies may be employed in one or more code segments of the computer program. For example, a code segment executed by the information handling system may include one or more steps of the disclosed methodologies. It will be understood that a processing device may be configured to execute or otherwise be programmed with software, firmware, logic, and/or other program instructions stored in one or more non-transitory tangible computer-readable mediums (e.g., data storage devices, flash memories, random update memories, read only memories, programmable memory devices, reprogrammable storage devices, hard drives, floppy disks, DVDs, CD-ROMs, and/or any other tangible data storage mediums) to perform the operations, tasks, functions, or actions described herein for the disclosed embodiments.

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touch screen and/or a video display. The information handling system may also include one or more buses operable to transmit communications between the various hardware components.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed methods and systems may be utilized in various combinations and/or independently. Thus the invention is not limited to only those combinations shown herein, but rather may include other combinations.

What is claimed is:

1. An information handling system, comprising:
a non-volatile random access memory (NVRAM) configured to store system configuration data;
a volatile random access memory (RAM) configured to store a copy of the system configuration data; and
a processing device programmed to:
in response to a request to put the system into a low power state, generate ECC data of at least the system configuration data and write the ECC data to the NVRAM; and
in response to a request to resume the system from the low power state:
read the system configuration data from the NVRAM and write it to the RAM to create the copy;
use the ECC data to determine whether the copy is corrupted; and then:
if so, use the ECC data to attempt to correct the corrupted copy, and
if not, resume running the system.

2. The information handling system of claim 1, where the processing device is further programmed to, in response to the request to resume the system from the low power state:
determine whether the processing device is able to correct the corrupted copy using the ECC data after the attempt to correct the corrupted copy; and then:
if so, resume running the system, and
if not, notify a user of a data correction failure and/or load a default version of the system configuration data into the NVRAM.

3. The information handling system of claim 1,
where the NVRAM is further configured to store a flag;
where the processing device is further programmed to, in response to the request to put the system into the low power state:
set the flag to indicate the ECC data is up to date after writing the ECC data to the NVRAM; and
where the processing device is further programmed to, in response to a request to write a portion of the system configuration data after the system has resumed from the low power state:
write the portion of the system configuration data to both the NVRAM and to the copy in the RAM without updating the ECC data; and
clear the flag to indicate the ECC data is not up to date.

4. The information handling system of claim 3,
where the processing device is further programmed to refrain from using the ECC data to determine whether the copy is corrupted and from attempting to correct the corrupted copy if the flag indicates the ECC data is not up to date; and
where the processing device is further programmed to use the ECC data to determine whether the copy is corrupted and to attempt to correct the corrupted copy if the flag indicates that the ECC data is up to date.

5. The information handling system of claim 3,
where the processing device is further programmed to refrain from writing the ECC data to the NVRAM if the flag indicates the ECC data of the NVRAM is up to date; and
where the processing device is further programmed to write the ECC data to the NVRAM if the flag indicates the ECC data of the NVRAM is not up to date.

6. The information handling system of claim 1,
where the processing device is further programmed to, in response to the request to resume the system from the low power state:
write the corrected copy to the NVRAM if the processing device determines the copy was corrupted and the ECC data was previously used to successfully correct the copy; and
notify a user of a data correction failure and/or load a default version of the system configuration data into the NVRAM if the processing device determines the copy was corrupted and was not successfully corrected using the ECC data.

7. The information handling system of claim 6,
where the processing device is further programmed to log to an event log of the information handling system an event indicating the system configuration data was corrupted.

8. The information handling system of claim 1,
where the processing device is further programmed to, in response to a request to read a portion of the system configuration data:
read the portion of the system configuration data from the copy in the RAM rather than from the NVRAM.

9. The information handling system of claim 1,
where the system configuration data comprises unified extensible firmware interface (UEFI) variables.

10. The information handling system of claim 1,
where the NVRAM comprises a flash memory device.

11. A method, comprising:
using at least one processing device of an information handling system having a non-volatile random access memory (NVRAM) configured to store system configuration data and a volatile random access memory (RAM) configured to store a copy of the system configuration data to:
in response to a request to put the system into a low power state, generate ECC data of at least the system configuration data and write the ECC data to the NVRAM; and
in response to a request to resume the system from the low power state:
read the system configuration data from the NVRAM and write it to the RAM to create the copy;

use the ECC data to determine whether the copy is
corrupted; and then:
if so, use the ECC data to attempt to correct the
corrupted copy, and
if not, resume running the system.

12. The method of claim 11, further comprising:
using the at least one processing device to, in response to
the request to resume the system from the low power
state:
determine whether the processing device is able to
correct the corrupted copy using the ECC data after
the attempt to correct the corrupted copy; and then:
if so, resume running the system, and
if not, notify a user of a data correction failure and/or
load a default version of the system configuration
data into the NVRAM.

13. The method of claim 11, further comprising:
using the at least one processing device to, in response to
the request to put the system into the low power state:
set a flag in the NVRAM to indicate the ECC data is up
to date after writing the ECC data to the NVRAM;
and
using the at least one processing device to, in response to
a request to write a portion of the system configuration
data after the system has resumed from the low power
state:
write the portion of the system configuration data to
both the NVRAM and to the copy in the RAM
without updating the ECC data; and
clear the flag to indicate the ECC data is not up to date.

14. The method of claim 13, further comprising:
refraining from using the ECC data to determine whether
the copy is corrupted and from attempting to correct the
copy if the flag indicates the ECC data is not up to date;
and
using the ECC data to determine whether the copy is
corrupted and attempting to correct the corrupted copy
if the flag indicates that the ECC data is up to date.

15. The method of claim 13, further comprising:
refraining from writing the ECC data to the NVRAM if
the flag indicates the ECC data of the NVRAM is up to
date; and
writing the ECC data to the NVRAM if the flag indicates
the ECC data of the NVRAM is not up to date.

16. The method of claim 11, further comprising:
using the at least one processing device to, in response to
the request to resume the system from the low power
state:
write the corrected copy to the NVRAM if the processing device determines the copy was corrupted and
the ECC data previously used to successfully correct
the copy; and
notify a user of a data correction failure and/or load a
default version of the system configuration data into
the NVRAM if the processing device determines the
copy was corrupted and was not successfully corrected using the ECC data.

17. The method of claim 16, further comprising:
using the at least one processing device to log to an event
log of the information handling system an event indicating the system configuration data was corrupted.

18. The method of claim 11, further comprising:
using the at least one processing device to, in response to
a request to read a portion of the system configuration
data:
read the portion of the system configuration data from
the copy in the RAM rather than from the NVRAM.

19. The method of claim 11,
where the system configuration data comprises unified
extensible firmware interface (UEFI) variables.

20. The method of claim 11,
where the NVRAM comprises a flash memory device.

* * * * *